United States Patent
Chen

(10) Patent No.: US 7,716,556 B2
(45) Date of Patent: May 11, 2010

(54) METHOD FOR CALCULATING AN ERROR DETECTING CODE

(75) Inventor: Ching-Yu Chen, Taipei Hsien (TW)

(73) Assignee: VIA Optical Solution, Inc., Hsin-Tien, Taipei Hsien (TW)

( * ) Notice: Subject to any disclaimer, the term of this patent is extended or adjusted under 35 U.S.C. 154(b) by 915 days.

(21) Appl. No.: 11/530,034

(22) Filed: Sep. 8, 2006

(65) Prior Publication Data

US 2007/0079182 A1    Apr. 5, 2007

(30) Foreign Application Priority Data

Sep. 9, 2005    (TW) .............................. 94131133 A

(51) Int. Cl.
*H03M 13/03*    (2006.01)
(52) U.S. Cl. .................................... 714/769
(58) Field of Classification Search ................ 714/752, 714/755, 763, 769, 774
See application file for complete search history.

(56) References Cited

U.S. PATENT DOCUMENTS

| | | | |
|---|---|---|---|
| 4,760,576 A | 7/1988 | Sako | |
| 4,979,174 A | 12/1990 | Cheng et al. | |
| 5,384,786 A * | 1/1995 | Dudley et al. ............... | 714/784 |
| 5,689,727 A | 11/1997 | Bonke et al. | |
| 5,793,724 A | 8/1998 | Ichikawa et al. | |
| 5,948,117 A | 9/1999 | Weng et al. | |
| 5,987,628 A | 11/1999 | Von Bokern | |
| 5,996,105 A | 11/1999 | Zook | |
| 6,024,286 A | 2/2000 | Bradley et al. | |
| 6,044,484 A | 3/2000 | Chung | |
| 6,075,920 A | 6/2000 | Kawamura et al. | |
| 6,260,169 B1 | 7/2001 | Massoudi | |
| 6,272,659 B1 * | 8/2001 | Zook .......................... | 714/774 |
| 6,367,049 B1 | 4/2002 | Van Dijk et al. | |
| 6,519,735 B1 | 2/2003 | Holman | |
| 6,564,362 B2 | 5/2003 | Osaki et al. | |
| 6,574,776 B1 | 6/2003 | Chiang | |
| 6,615,387 B1 | 9/2003 | Williamson et al. | |
| 6,742,157 B2 | 5/2004 | Shieh et al. | |

FOREIGN PATENT DOCUMENTS

| | | |
|---|---|---|
| TW | 366448 | 8/1999 |
| TW | 413755 | 12/2000 |
| TW | 442722 | 6/2001 |
| TW | 459175 | 10/2001 |

* cited by examiner

*Primary Examiner*—Shelly A Chase
(74) *Attorney, Agent, or Firm*—Winston Hsu

(57) ABSTRACT

A method applied to an optical disc drive for calculating an error detection code corresponding to a data sector is disclosed. The data sector includes a plurality of bytes arranged in a matrix having N lines along a first direction and M lines along a second direction perpendicular to the first direction. The method includes: along the first direction, calculating error detection codes corresponding to M bytes located at each of the N lines, wherein for each of the N lines, only bytes having error bits affect an error detection code for the line; adjusting an error detection code of each of the N lines according to a displacement between each of the N lines and a last line of the N lines; and then determining the error detection code of the data sector by summing up the displacement-adjusted error detection code of each of the N lines.

18 Claims, 13 Drawing Sheets

METHOD FOR CALCULATING AN ERROR DETECTING CODE

BACKGROUND OF THE INVENTION

1. Field of the Invention

The invention relates to a method for calculating an error detection code (EDC), and more particularly, to a method for calculating an error detection code, where the method can simplify related circuits and utilize pipeline calculation.

2. Description of the Prior Art

In a process of encoding and decoding digital data and a process of reading and writing digital data, the digital data are often arranged in a two-dimensional matrix. Additional digital code data are added into the two-dimensional matrix in order to check the accuracy of the digital data stored inside the two-dimensional matrix. In addition, as the amount of digital data increases, the two-dimensional matrix is often formed by a plurality of data blocks each having a plurality of data sectors, which have a predetermined format. Please refer to FIG. 1, which is a diagram of a conventional two-dimensional matrix. As shown in FIG. 1, the entire two-dimensional matrix can be divided into several data sectors, where each data sector can be further divided into multiple rows CW1-CW208 and multiple columns CW'1-CW'182. In the multiple bytes of each row, the partial bytes arranged in the front of the row have more bytes and correspond to the digital data. On the other hand, the partial bytes arranged in the back of the row have fewer bytes and correspond to a first error correction code (i.e., the parity of inner, PI), utilized for correcting the digital data in the same row. Similarly, in the multiple bytes of each column, the partial bytes arranged in the front of the column have more bytes and correspond to the digital data. On the other hand, the partial bytes arranged in the back of the row have fewer bytes and correspond to a second error correction code (i.e., the parity of outer, PO), utilized for correcting the digital data in the same column. Furthermore, each data sector further comprises cyclic redundancy check (CRC) bytes. For example, as shown in FIG. 1, the encoding units 2171-2174 in the data sector (1) correspond to the above-mentioned CRC bytes. That is, when the data are written into a disc, the CRC bytes are added to each data sector.

According to the two-dimensional matrix format and the algorithms (e.g.: Reed-Solomon algorithm, Galois Field algorithm, Euclidean algorithm, and Berlekamp-Massey algorithm) of the error detection code and error correction code, if the two-dimensional data, which are written into the memory, have no errors in each byte (for example, the data are correctly written into the memory without noise interference of the circuit or without an operational error of the pickup head), the first error correction code (i.e., PI) and the digital data in each row have a one-to-one corresponding relationship and the second error correction code (i.e., PO) and the digital data in each column have a one-to-one corresponding relationship. Furthermore, the accumulation of effects of all bytes on the error detection code of the entire data sector is theoretically equal to the error detection code of the data sector (because there are no error bytes in the data sector).

Therefore, in the practical application, the first error correction code of each row and the second error correction code of each column are first utilized to find out bytes having error bits (especially to find out the bytes having error bits that cannot be corrected using these error correction codes). Then, the effects of the aforementioned bytes, which have error bits, on the error detection code of each data sector are processed, where the calculation result and the error detection code (corresponding to the above CRC code) located in the last few bytes of the non-error-correction-code part in the data sector are utilized to verify the result of utilizing the error correction codes to correct error bits in the digital data. Therefore, through repeatedly utilizing the error correction codes and the error detection code to process the digital data in the two-dimensional matrix, the error rate can be reduced to $10^{-12}$ or even less than $10^{-12}$.

In today's technology, when the effects of all error bytes of a certain data sector on the error detection code of the data section are being calculated, the digital data of each row/column are often processed by a row-by-row in sequence/column-by-column in sequence method. As shown in FIG. 2, the row-by-row in sequence method starts from the first byte of the first row, and then sequentially proceeds to all bytes of the first row. Then the first byte of the second row is processed, and all bytes of the second row are sequentially processed. Until all the bytes of the last row are processed, the effects of all error bytes on the error detection code of the data sector cannot be obtained.

The column-by-column in sequence method as shown in FIG. 3, is illustrated as follows. First, the first byte of the first column is processed. Then, all bytes of the first column are sequentially processed. Then the first byte of the second column is processed, and all bytes of the second column are sequentially processed. Until all the bytes of the last column are processed, the effects of all error bytes on the error detection code of the data section cannot be obtained.

In other words, when an error byte is discovered, the prior art method of calculating the effect of the error value of the error byte upon the error detection code is illustrated as follows. First, the prior art method shifts the error value from its original location at the $K^{th}$ row ($K^{th}$ column) to the last byte along the $K^{th}$ row ($K^{th}$ column). The displacements from the error byte through the last byte of the $K^{th}$ row ($K^{th}$ column) are determined, and the effects of the displacements upon the error value are calculated. Next, the method further shifts the adjusted error value to the first byte of $K^{th+1}$ row ($K^{th+1}$ column), the displacement between the first byte of the $K^{th+1}$ row ($K^{th+1}$ column) and the last byte of the $K^{th}$ row ($K^{th+1}$ column) is determined, and the effect of the displacement upon the error value is calculated. Finally, the method shifts the adjusted error value from the first byte through the last byte of the $K^{th+1}$ row ($K^{th+1}$ column), the displacements from the first byte through the last byte of the $K^{th+1}$ row ($K^{th+1}$ column) are determined, and the effects of the displacements upon the error value are calculated. In this way, the prior art method shifts the error value to a last byte of a current row (column), then shifts it to a first byte of a next row (column), and then shifts it to a last byte of the next row (column), and so on, until the method shifts the found error value to the last byte of the last row (column) such that the above-mentioned error detection code is completely calculated.

Please note that the concept of utilizing the error correction codes and the error detection code in the digital data processing procedure (for example, the above-mentioned encoding operation and decoding operation) is only illustrated in short, and further detailed illustration is omitted here for brevity. More related information can be obtained from U.S. Pat. Nos. 4,760,576, 4,979,174, 5,689,727, 5,793,724, 5,948,117, 5,996,105, 6,024,286, 6,044,484, 6,075,920, 6,260,169, 6,367,049, 6,564,362, 6,574,776, 6,615,387, and 6,742,157.

However, because electronic products are increasingly more light, thin, short, and small, it is a key point to reduce their cost and raise their efficiency. Therefore, a smart solution capable of utilizing the above-mentioned error correction codes and error detection code more efficiently and cheaply is required. For example, a solution of calculating the effects of the error bytes upon the error detection codes is always a field requiring attention and further rese h.

It is therefore one of the primary objectives of the claimed invention to provide a method of calculating the error detection code, and more particularly, to provide a method of calculating the error detection code through utilizing fewer memory space and utilizing fewer calculation processes, to solve the above-mentioned problem.

According to an exemplary embodiment of the claimed invention, a method applied to an optical disc drive for calculating an error detection code corresponding to a data sector is disclosed. The data sector comprises a plurality of bytes, where the plurality of bytes is arranged in a matrix, and the matrix has N lines along a first direction and M lines along a second direction orthogonal to the first direction. The method comprises: (a) along the first direction, calculating error detection codes corresponding to M bytes located at each of the N lines, wherein for each of the N lines, only bytes having at least one error bit have a non-zero effect on an error detection code corresponding to the line; and (b) adjusting an error detection code of each of the N lines according to a displacement between each of the N lines and a last line of the N lines, and then determining the error detection code of the data sector by summing up the displacement-adjusted error detection code of each of the N lines.

In addition, in other embodiments of the claimed invention, above exemplary embodiment is modified to introduce the pipeline calculation. Through adjusting the operations executed by different pipelines or modifying the connection relation between different pipelines, multiple operations are allowed to be executed in the same time period to thereby reduce the computation time or memory space required for buffering computational data.

These and other objectives of the present invention will no doubt become obvious to those of ordinary skill in the art after reading the following detailed description of the preferred embodiment that is illustrated in the various figures and drawings.

Figure 1:
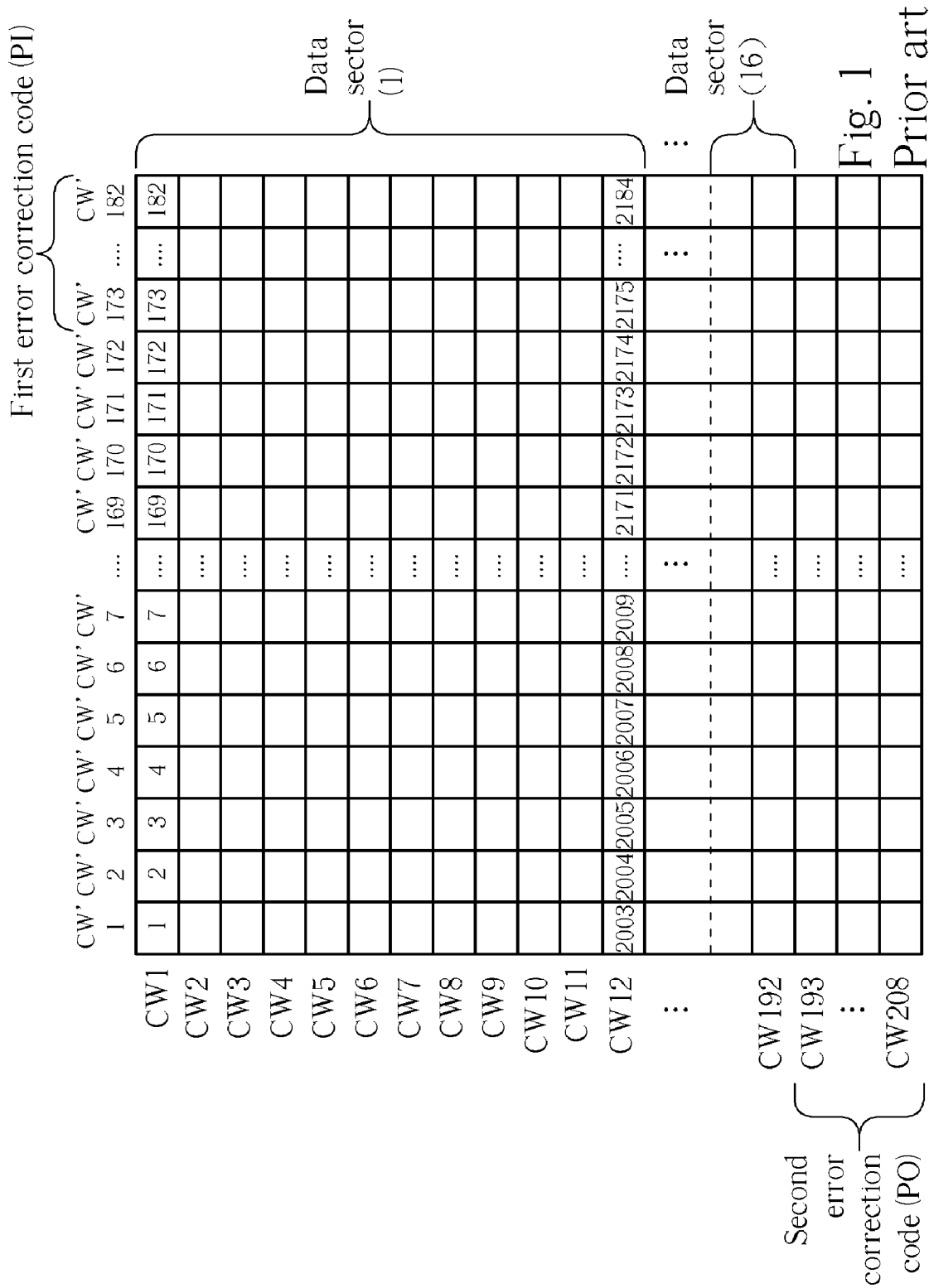
FIG. 1 is a diagram illustrating data stored on a conventional optical disc.

Some objectives and advantages of the present invention can be summarized as follows.

(1) When the effects of the error value of each error byte upon the error detection code in the two-dimensional matrix (e.g.: a data sector) are being calculated, the displacement between each error byte and the position storing the error detection code of the two-dimensional matrix is calculated. Please note that the displacement between the error byte and the last byte of the row (column), which comprises the error byte, is directly calculated, and then the displacement between the last byte of the row having the error byte and the byte for storing the error detection code is directly calculated. Here, in general, the error detection code is stored in the end of the data sector utilized for storing digital data. Therefore, the calculation of the effects of the error bytes upon the error detection code is performed along the row (column) from the error byte through the end of the row (column). Please note, however, that the calculation can also be performed according to the position storing the error detection code. That is, the calculation can shift along the row (column) having the error byte to a specific byte, which is located in the same row (column) where the error value is directly shifted to the specific byte using the above-mentioned displacement adjustment. Then, the calculation further shifts along the rows (columns) to the byte storing the error detection code according to the above-mentioned displacement adjustment. Finally, a summation operation is performed such that the wanted error detection code can be calculated.

(2) A pipeline calculation can be utilized to allow the error value of a certain error byte and the error value of a next error byte to be calculated at the same time such that the needed operation time can be reduced.

(3) A pipeline calculation can be utilized to allow the operation of calculating the error value of a current error byte, an operation of looking for a next error byte, and a displacement applied to an obtained error value to be performed at the same time such that the needed operation time can be reduced.

(4) Pipeline calculations can be utilized. When a pipeline calculation finds out the error value of an error byte, another pipeline calculation can be immediately utilized to calculate the displacement applied to the error value of the error byte without waiting for the displacement of the previously obtained error value to be completely calculated. This can reduce needed operation time.

(5) The relative distance between error bytes does not have to be utilized. Instead, the absolute distance between each byte and the end of the row (column) can be utilized such that the calculation can be simplified and the circuit for performing the calculation can be simplified also.

In the following disclosure, the present invention's spirit, embodiments, objects, and advantages will be disclosed. First, in the prior art, the calculation of the error detection code has a common characteristic. That is, the effect of the error value of a certain error byte upon the entire data sector is only related to the displacement between the certain byte and the byte storing the error detection code, but is not related to which path is selected from the certain byte to the byte of the error detection code. Here, each path from the certain byte to the byte of the error detection code corresponds to a kind of hardware/firmware/software for achieving the displacements corresponding to the path. Because it is impossible to predict which bytes in each data sector have errors, each byte used for storing data needs a dedicated displacement to move to the byte storing the error detection code. In the practical implementation, in order to simplify the circuit hitecture and reduce the cost, all possible displacements are divided into several basic procedures according to the order of processing each byte in the data sector. That is, the circuit is correspondingly divided into several basic hardware/firmware/software parts. Therefore, if the number of needed basic procedures is smaller, the needed basic hardware/firmware/software parts become fewer such that the circuit hitecture is simpler and the cost is reduced.

In addition, the inventor of the present invention further discloses that the prior art flow of generating the error detection code can be divided into three steps: (i) Finding out error bytes (the byte having error bits) in the encoded data (data sector). (ii) Calculating the error detection code of each error byte. (iii) Calculating the error detection code generated by combining all error detection codes of all error bytes. Please note that all bytes have to be checked and the error detection codes are calculated according to a predetermined rule. The above-mentioned steps (i) and (ii) take a fixed time. In other words, only the step (iii) can be changed and simplified by changing the procedure of processing all bytes such that the time and circuit for the step (iii) can be reduced and simplified.

According to the above-mentioned thoughts, the inventor of the present invention points out that the method of row-by-row in sequence or the method of column-by-column in sequence according to the prior art needs at least three basic displacement operations. (a) Along a certain row or a certain column, move from a certain byte to a next byte. (b) From the last byte of a certain row (column) to the last byte of a next adjacent row (next adjacent column). (c) From the last byte of a certain row (column) to the first byte of the certain row (column). Obviously, the basic displacement operation (c) is performed due to the prior art in sequence method. However, the inventor of the present invention emphasizes that since the calculation of the error detection code is not related to the path, if an error byte is discovered and needs to be corrected, a shortest path (or the least calculations), for moving the error value of the error byte to the position of the byte storing the error detection code of a data sector, is the most efficient path. At the same time, because the procedure of finding out the error bytes needs to move between different bytes, if the paths in steps (1) and (3) can be integrated together (please note that the step (2) is not related to the path), the entire operation can be more efficient and the cost will be reduced.

Therefore, the inventor of the present invention discloses a method applied to an optical disc drive for calculating the error detection code corresponding to a data sector. The data sector comprises a plurality of bytes arranged in an N*M matrix. The key characteristic of the method is: only in each row (column) are the bytes processed in sequence or the bytes are processed individually. Appropriate displacement adjustment and adding operations are utilized to sum up the error detection codes (i.e., error values) caused by all error bytes. (Please note, for the Galois Field arithmetic, the adding operation is the XOR operation). After each row or each column is completely processed (that is, the last byte of the row or the column is processed), however, the displacement adjustment is performed to directly move the error detection code of each row/column to the end of the last row/column, which is utilized to store the error detection code of the data sector; or to directly move the error detection code of each row/column to the end of the next row/column, which is utilized to store the error detection code of the next row/column. In other words, the calculation of the error detection code of the data sector is for directly performing the displacement adjustment on the error detection code of a processed row/column to move across unprocessed rows/columns to the end of the data sector, which is utilized to store the error detection code. This is in contrast to the prior art, which needs to sequentially process all bytes located at unprocessed rows/columns.

Figure 2:
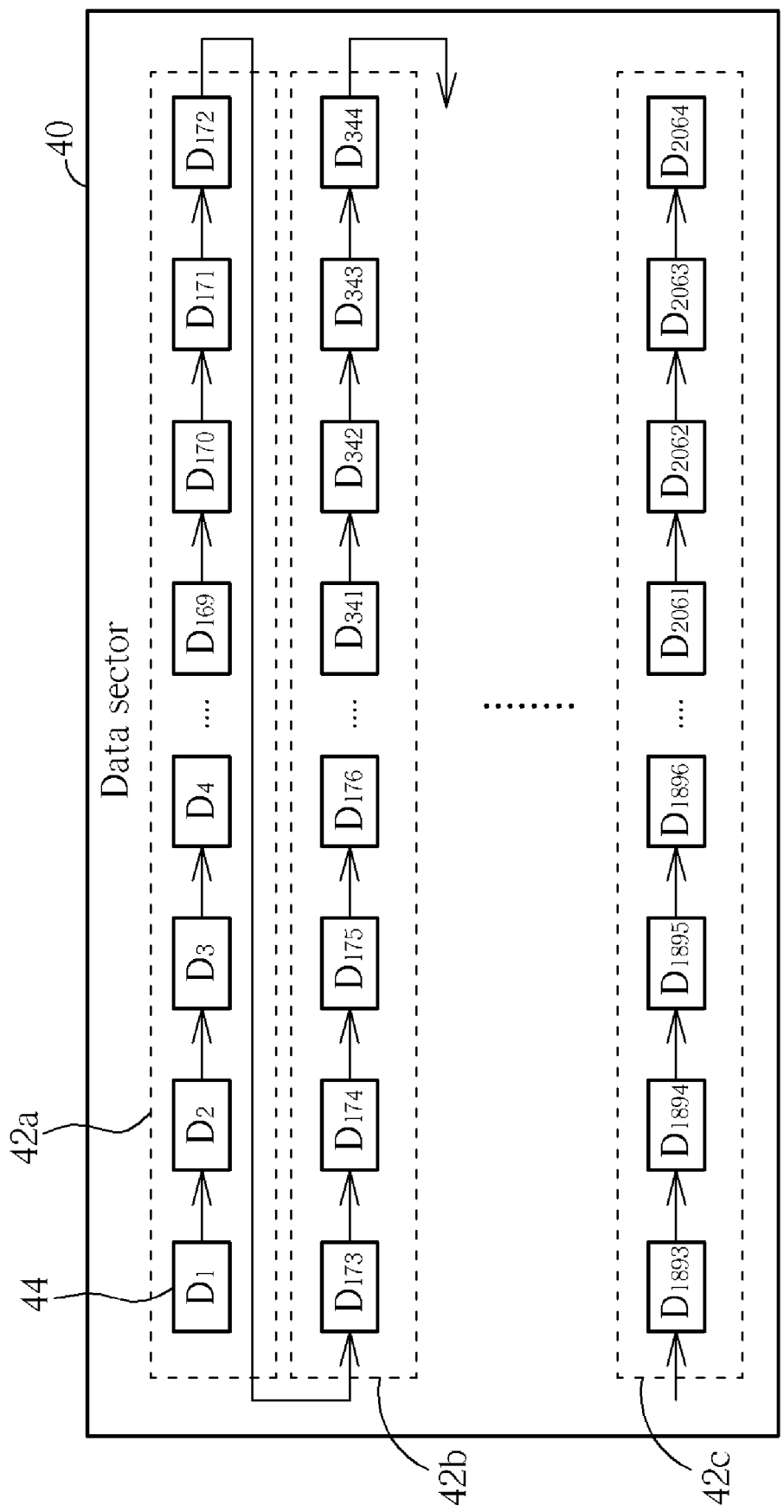
FIG. 2 is a first diagram illustrating the data sector in the error correction procedure according to the prior art.
Figure 3:
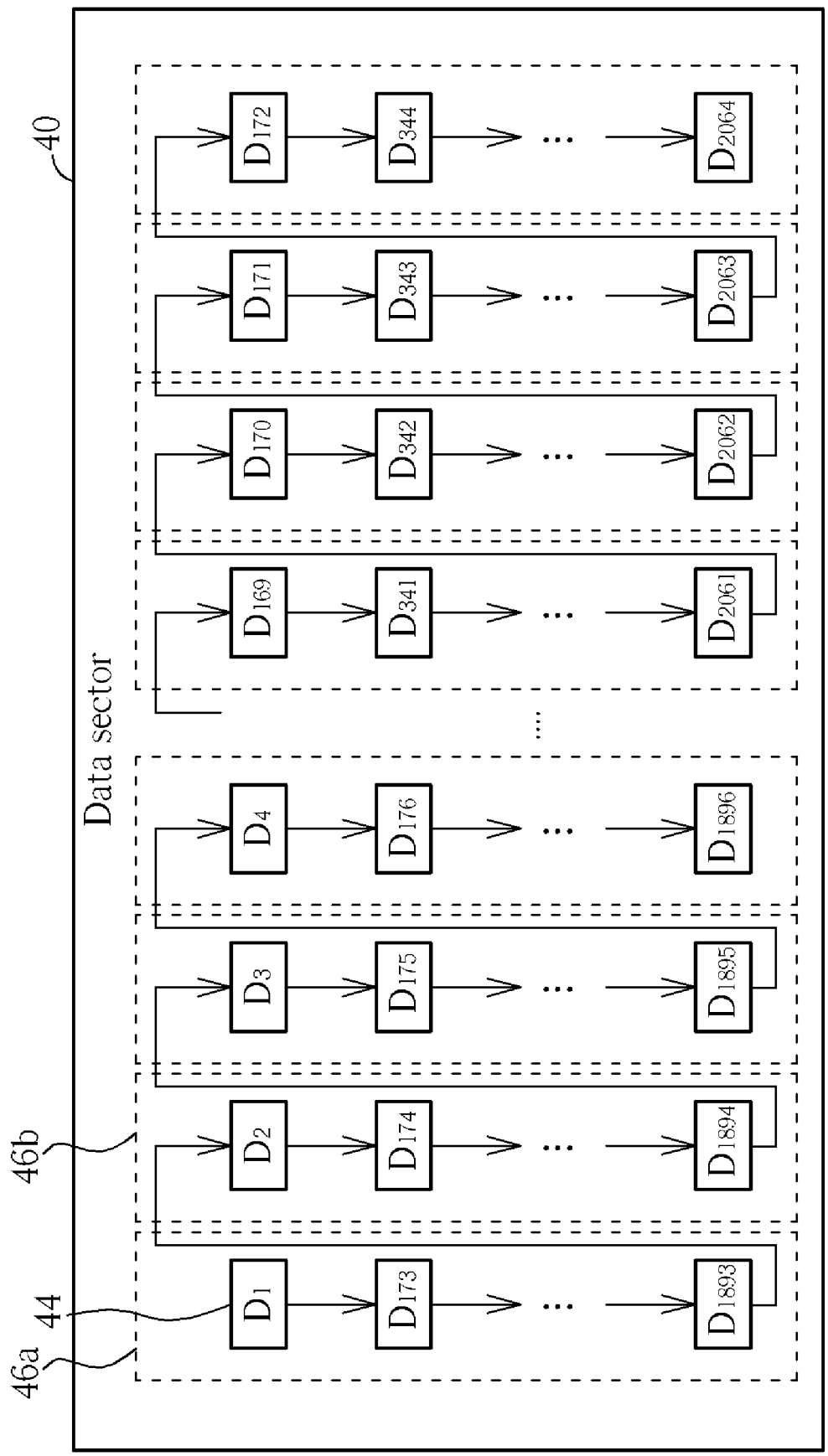
FIG. 3 is a second diagram illustrating the data sector in the error correction procedure according to the prior art.
Figure 4:
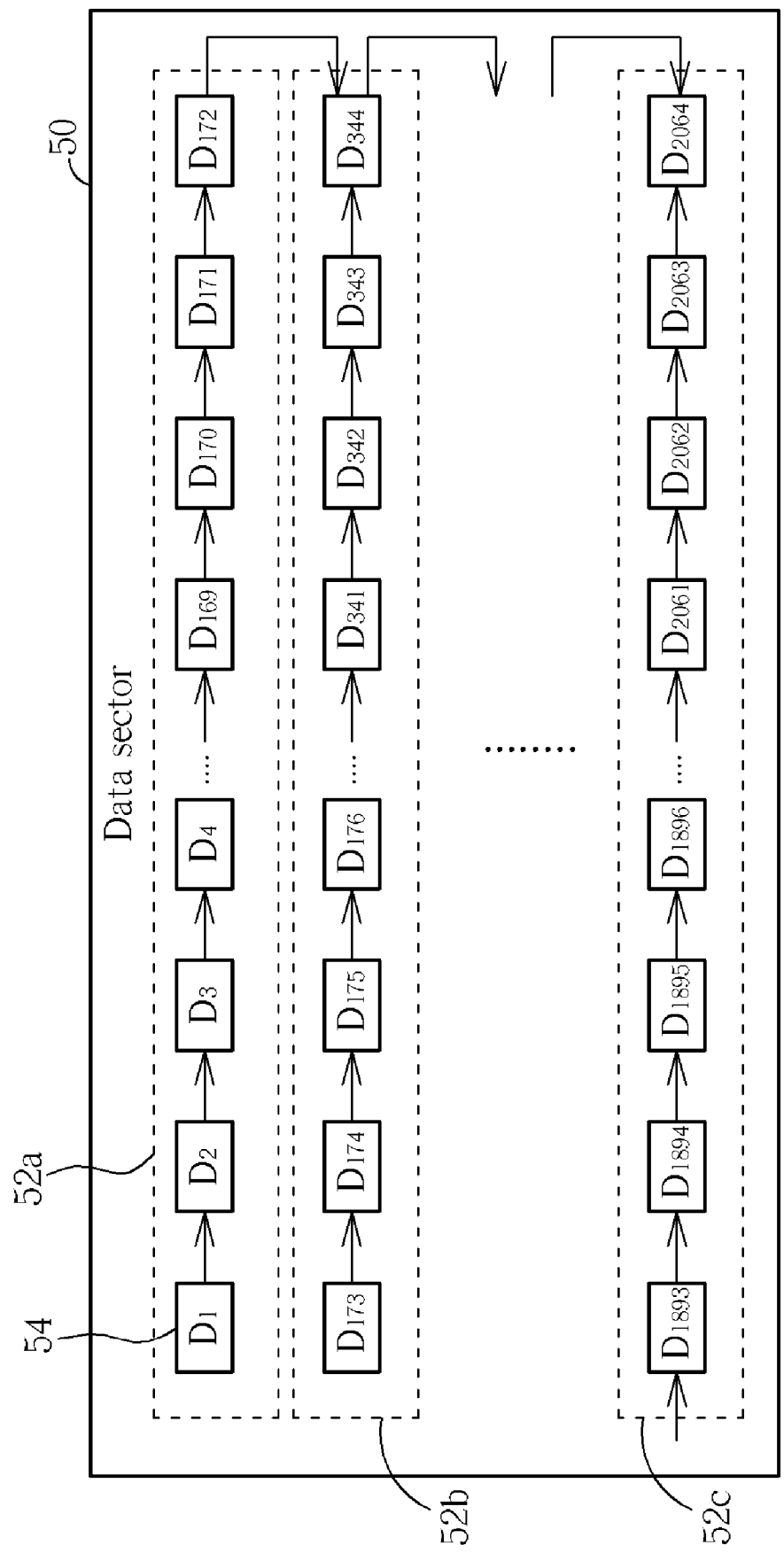
FIG. 4 is a first diagram illustrating the data sector in the error correction procedure according to the present invention.
Figure 5:
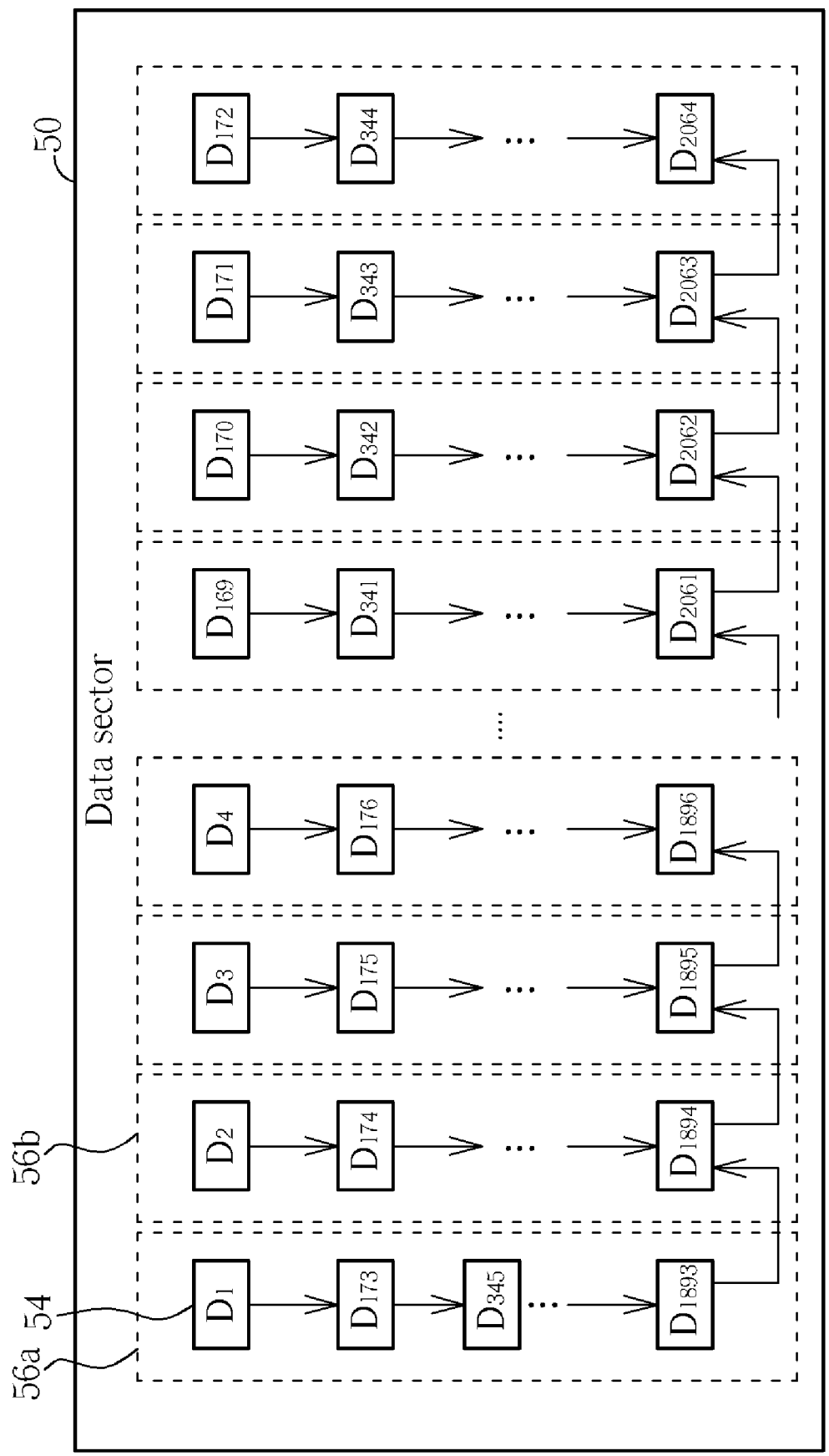
FIG. 5 is a second diagram illustrating the data sector in the error correction procedure according to the present invention.

Please refer to FIG. 4 and FIG. 5 in conjunction with FIG. 2 and FIG. 3. FIG. 4 and FIG. 5 are flow charts illustrating calculation of the error detection code according to the present invention. It can be seen that the present invention has at least the following advantages:

(1) In each row/column, each byte is processed in sequence. This can be combined with the above-mentioned step (i).

(2) The present invention only needs to (a) move along a certain row/column direction to a next byte and (b) move to the last byte of a next adjacent row/column from the last byte of a certain row/column. In contrast to the prior art, the present invention can save a basic displacement operation and related hardware/firmware/software part.

(3) Because the processing upon a certain row/column is not related to any other rows/columns, the present invention, in contrast to the prior art, is not limited to start the processing of a next row/column after completing the processing of a certain row/column. Therefore, the present invention can respectively (even simultaneously) process different rows/columns such that the total time of the entire operation can be reduced.

(4) Because each column can be processed respectively, the error detection code process can be performed on each column just after one row is completely read. This is in contrast to the prior art, which needs to read all rows and then perform the error detection code process. This allows the present invention to combine the process of reading data sector and the process of processing each column to obtain the second error correction code and the error detection code. In the prior art, the process of reading the data sector can be only combined with the process of processing each row but cannot be combined with the process of processing each column.

(5) Because the effects caused by the error bytes upon the error detection code can be dividedly processed, when only a few bytes are adjusted in the data sector, the error detection code can be recalculated in response to the adjusted bytes only. Furthermore, the effects caused by the error bytes upon the error detection code can be selectively reconfirmed when the error detection code needs to be validated such that possible error sources can be determined.

In addition, the inventor of the present invention also discloses a method applied to an optical disc drive for calculating an error detection code corresponding to a data sector. The data sector comprises a plurality of bytes arranged in an N*M matrix. The method comprises at least the following steps: processing each row of the N*M matrix (and processing all bytes of each row); when the $K^{th}$ column is being processed, if a byte is discovered to have error bits, the error detection code corresponding to the error byte can be first calculated in order to adjust the error byte and then the displacement between the error byte between a predetermined byte of the $K^{th}$ row (often the last byte of the $K^{th}$ row) is utilized to adjust the error detection code to update the error correction code corresponding to the predetermined byte of the $K^{th}$ row. After the $K^{th}$ row is processed and the next $K^{th+1}$ row needs to be processed, the error detection code is adjusted again according to the displacement between the $K^{th}$ row and the $K^{th+1}$ row. In addition, after all rows and all bytes of each row are processed, the adjusted error detection codes, corresponding to all error bytes and adjusted through the displacement adjustment, are summed up to obtain the error detection code corresponding to the processed data sector. Then, the error detection code and a certain value can be utilized to determine whether the content of the processed data sector is correct. Similarly, the method can be changed to process each column (and all bytes of each column) of the N*M matrix. Furthermore, instead of sequentially processing each row/column, the present invention can follow the data reading procedure to simultaneously process a plurality of rows/columns.

Moreover, if the procedure of reading the data section does not have to be combined with the procedure of generating error detection codes, the present invention can also be changed as follows: when the error detection code of a certain byte is discovered, the number of basic displacements between the certain byte to the byte storing the error detection code along the row (or column) direction and the number of basic displacements between two adjacent columns (rows) along the row direction (column direction) can be directly determined. Then, the error detection codes are directly adjusted according to these above-mentioned displacements. Finally, these error detection codes are directly summed up to obtain the error detection code of the data sector.

According to the above disclosure, the present invention provides a method of obtaining a first error correction code, a second error correction code, and the error detection code such that the calculation of each row and each column can be combined with the procedure of reading the data sector. This also reduces the cost and raises the efficiency. Here, it is emphasized that the present invention can be utilized in cooperation with the prior art. For example, the calculation of each row can be in accordance with the prior art method, but the calculation of each column is in accordance with the present invention operation.

In addition, in the procedure of processing each row or each column, the present invention can have the following modifications. That is, after an error byte is discovered in a certain row/column, the error detection code of the error byte is first calculated and then the obtained error detection code is adjusted according to the displacement between the error byte to the end (the last byte) of the certain row/column.

Moreover, in the procedure of processing multiple rows or multiple columns, the present invention can have the following modifications. That is, after the summing operation of error detection codes of a certain row/column is completely performed, the displacements of the error detection code of the certain row/column are first applied to move the error detection code to the place storing the error detection code of the data sector. Then, after all rows or all columns complete the summing operation and displacement adjustment of the error detection codes, these error correction codes generated from all rows/columns are summed up to obtain a final error detection code for the data sector.

Figure 6:
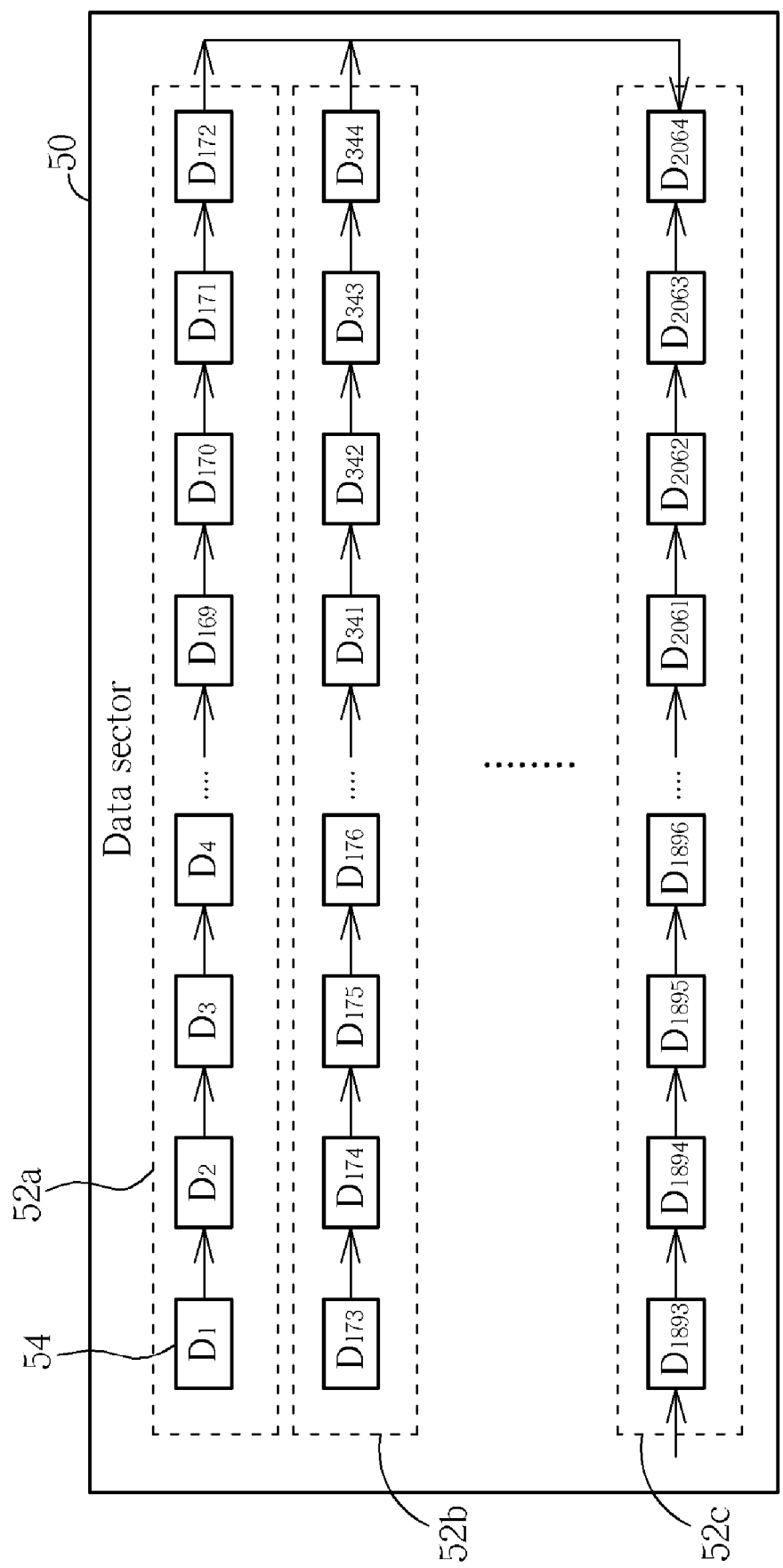
FIG. 6 is a third diagram illustrating the data sector in the error correction procedure according to the present invention.
Figure 7:
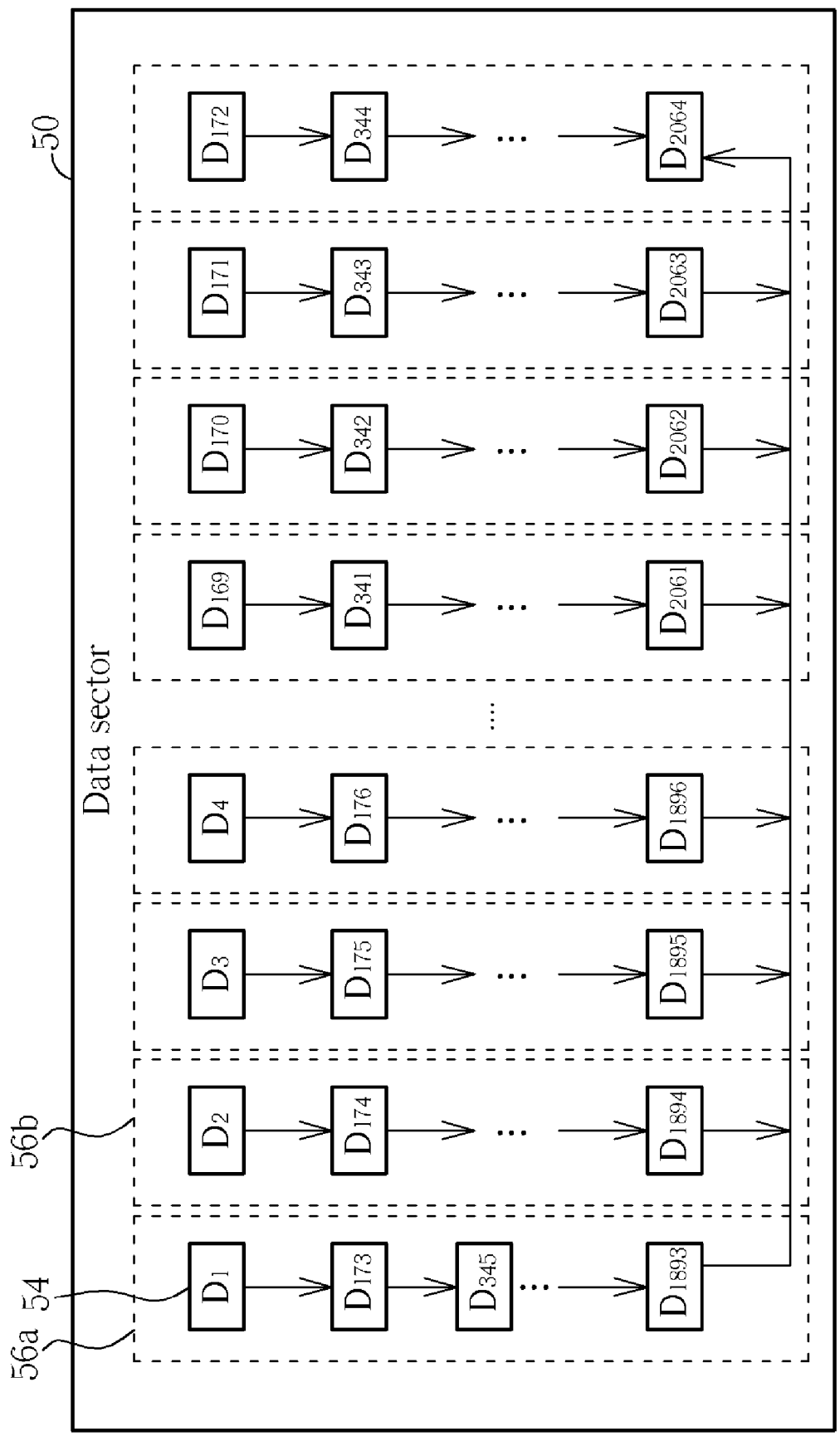
FIG. 7 is a fourth diagram illustrating the data sector in the error correction procedure according to the present invention.

In addition, after the summing operation of error detection codes of a certain row/column is completely performed, the error detection code of the certain row/column is moved to the end of a next row/column through a displacement adjustment. After the error detection code of the next row/column is calculated, the error detection codes of the two rows/columns are summed up. Then the summed error detection code is moved to another next row/column through the displacement adjustment. The above-mentioned operation is repeatedly performed until the error detection code of a last row/column is summed up such that a final error detection of the data sector can be obtained. Please refer to embodiments shown in FIG. 6 and FIG. 7 and compare the embodiments shown in FIG. 6 and FIG. 7 with those shown in FIG. 3 and FIG. 4. The embodiments shown in FIGS. 3-7 all belong to the scope of the present invention.

Utilizing the same concept, in the procedure of processing each row/column, the present invention can have following modifications (not shown in Figures). For example, after the error detection code of a certain byte in a certain row/column is completed, the error detection code is firstly moved to the end of the row/column having the certain byte through the displacement adjustment. Then, the row/column is se hed to find out other error bytes, and the error detection code calculation and displacement adjustment of calculated error detection code are performed. Finally, the results of all error bytes are summed up to obtain the error detection code of the row/column after the last byte of the row/column has been processed. Furthermore, after the error detection code of the first byte of a certain row/column, the error detection code can be moved to a next byte through the displacement adjustment and be summed up with the error detection code of the next found error byte. The above-mentioned operation is repeatedly performed until all bytes of the certain row/column are summed such that the error detection code of the certain row/column is obtained. This change also obeys the spirit of the present invention.

The difference between characteristics of the present invention and the prior art is: the displacement path used for calculating the error detection code in step (iii), which comes from the error detection codes of error bytes. Therefore, when each row/column is being processed, the present invention can adopt in sequence method as the prior art does.

Figure 8:
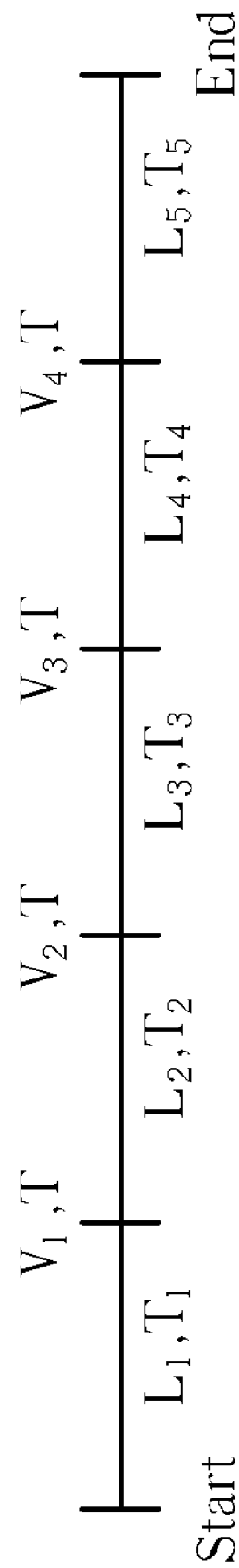
FIG. 8 is a diagram illustrating the operation of calculating error detection code of a certain row/column.

For further illustration, please refer to FIG. 8. In FIG. 8, $V_1$, $V_2$, $V_3$, $V_4$ respectively represent four error values corresponding to four error bytes in a certain row/column. T represents the time period used for calculating the error value of any error byte. $L_1$ represents the distance between the error byte to the start of the certain row/column. $L_2$, $L_3$, and $L_4$ respectively represent the distances between two error bytes. $L_5$ represents the distance between the last byte and the end of the certain row/column. $T_1$ represents the time period for checking the bytes from the start to a first error byte. $T_2$, $T_3$, and $T_4$ respectively represent the time period for checking all bytes between two adjacent error bytes. $T_5$ represents the time period for checking the bytes from the last error byte to the end of the row/column. It is clear that the time period for checking the certain row/column (proportional to the consumption of the bandwidth) is $T_1+T+T_2+T+T_3+T+T_4+T+T_5=T_1+T_2+T_3+T_4+T_5+4T$. Please note that, for the purposes of simple illustration, the lengths of $L_1$, $L_2$, $L_3$, and $L_4$ shown in FIG. 8 are all equal to each other. However, in the practical implementation, the appearance of error bits is not predictable. Therefore, the error bytes are randomly distributed. That is, the lengths of $L_1$, $L_2$, $L_3$, and $L_4$ are not guaranteed to be the same. Similarly, in the following embodiments, the position of error byte, the distances, and the time periods are only utilized as examples, not limitations of the present invention.

Figure 9:
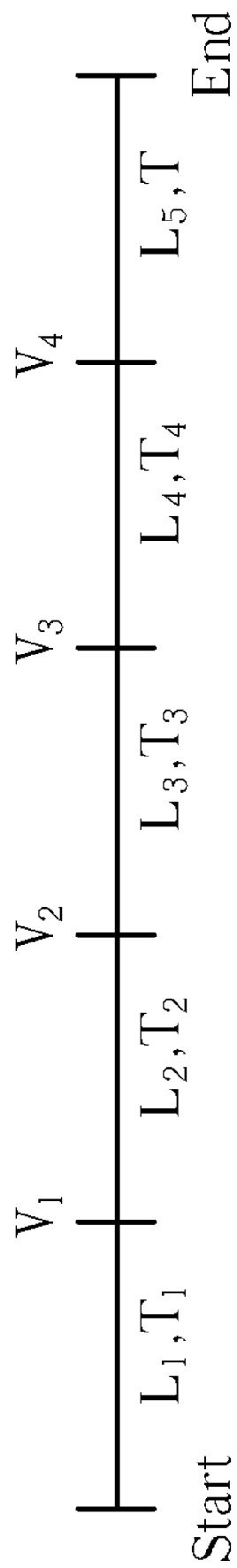
FIG. 9-13 are diagrams illustrating the operation of calculating error detection codes in pipeline calculation according to the present invention.

However, with the progress of technology, the processing rate of hardware/firmware/software is getting faster and faster. Some applications, such as pipeline calculation, capable of raising data processing rates are utilized in current systems. Therefore, the above-mentioned time period $T_1+T_2+T_3+T_4+T_5$ can be further reduced. For example, if the hardware/firmware/software is advanced and has faster processing rate, the time period for calculating each error value will be short enough. That is, in FIG. 8, T is less than or equal to the minimum of $T_2$, $T_3$, and $T_4$. In this way, after the required data are ready, the present invention method can simultaneously perform the error value calculation of a certain error byte and the se hing operation of a next error byte. At this time, the process shown in FIG. 8 can be changed into the process shown in FIG. 9. In addition, the time period for checking the row/column (proportional to the consumption of the bandwidth) is $T_1+T_2+T_3+T_4+T$. If a distance between two error bytes is too short (for example, $N^{th}$ error byte and $N^{th+1}$ error byte), this makes the time period for se hing the $N^{th+1}$ error byte be shorter than the time period for calculating the error value of the $N^{th}$ error byte. At this time, after the calculation of the error value of the $N^{th}$ error byte is performed, the operation of se hing the $N^{th+2}$ error byte and the operation of calculating the error value of the $N^{th+1}$ error byte can be simultaneously performed. Moreover, the present invention can perform the operation of calculating the error values of $N^{th}$ error byte and $N^{th+1}$ error byte, and simultaneously perform the operation of se hing the $N^{th+2}$ error byte. Obviously, in the embodiment shown in FIG. 9, the time for calculating the error values can be ignored under an ideal condition.

Figure 10:
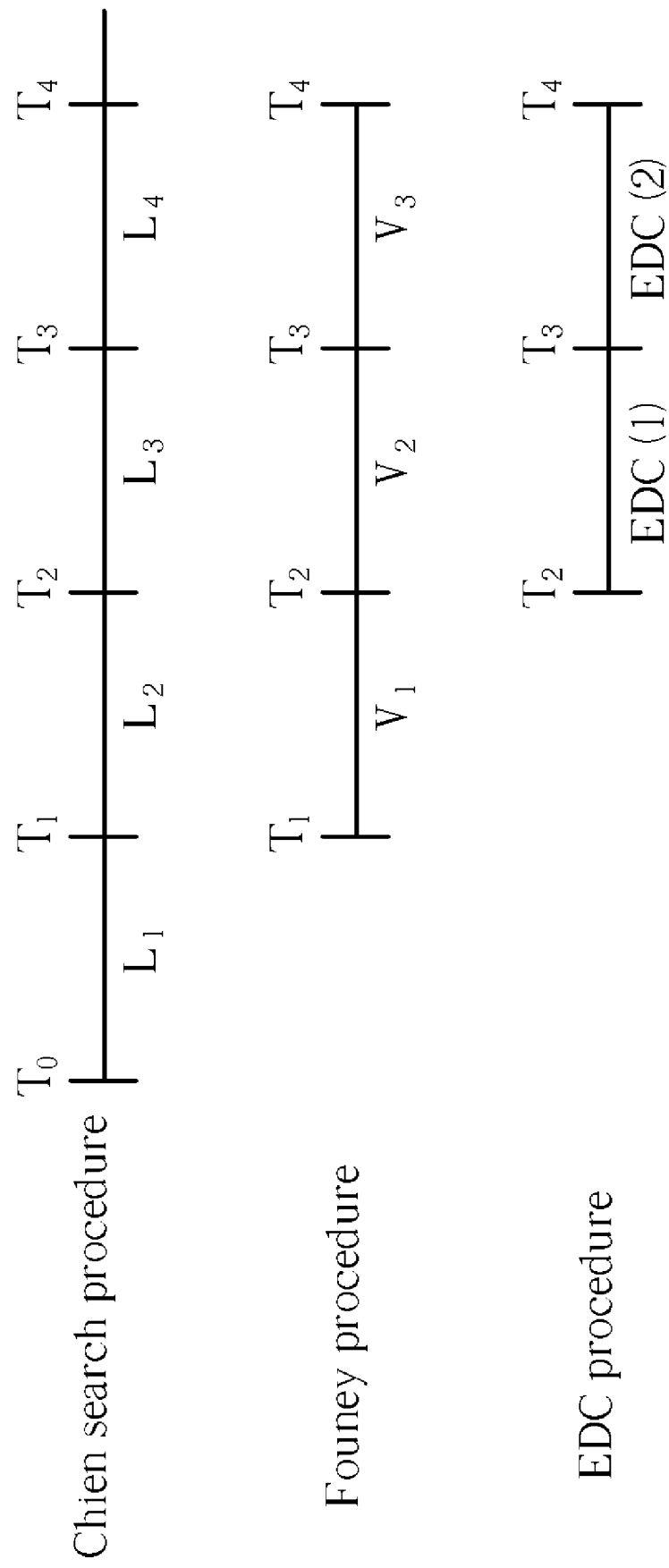

Furthermore, the process shown in FIG. 8 can further use the pipeline calculation mechanism to simplify the entire process. Please refer to FIG. 10. This embodiment respectively utilizes a first procedure (i.e., a Chien Se h procedure), a second procedure (i.e., a Founey procedure), and a third procedure (i.e., an EDC procedure) to know the locations of the error bytes, to know the error values of error bytes having error bits, and to perform the calculation of error detection codes (the above-mentioned displacement adjustment of error detection codes and summing operation). Here, from the time $T_0$, the Chien Se h procedure se hes the position $L_1$ of the error byte. If the time of se hing the first error byte is $T_1$, from $T_1$, not only does the Chien se h procedure still find the position $L_2$ of a next error byte, but also the Founey procedure calculates the error value $V_1$ of the first error byte. On the other hand, if the time of se hing the second error byte is $T_2$, from $T_2$, not only does the Chien se h procedure still find the position $L_3$ of a next error byte and the Founey procedure calculate the error value $V_2$ of the second error byte, but the EDC procedure starts to calculate the effect EDC(1) (that is, to calculate the displacement adjustment of the error detection code) caused by the first error byte (corresponding to the error value $V_1$) upon the error detection code. If the time of se hing the third error byte is $T_3$, from $T_3$, not only does the Chien se h procedure still find the position of a next error byte and the Founey procedure calculate the error value $V_3$ of the third error byte, but the EDC procedure starts to calculate the effect EDC(2) (that is, to calculate the displacement adjustments of the error detection codes and then to sum them up) caused by the first error byte and the second error byte upon the error detection code. The above-mentioned operations are continued until all bytes are processed. Obviously, in contrast to the process shown in FIG. 8, the pipeline calculation process shown in FIG. 10 is more efficient. Because some operations can be performed synchronously, the present invention does not have to use the in-sequence procedure (i.e. perform a next operation until a current operation is completed). The present invention can still perform a part of pipeline calculation processes asynchronously if necessary, for example if the hardware performance is not good enough to process all operations in time.

However, if the process shown in FIG. 10 is utilized in firstly determining the positions and error detection codes of all error bytes of each row/column and then processing effects caused by error bytes upon the error detection codes, instead of directly processing the effect caused by one error byte upon the error detection code and then processing the effect caused by a next error byte upon the error detection code, some disadvantages might be introduced. For example, the Chien se h procedure detects the positions $L_1$ ($1_{11}$–$1_{1n}$) of a plurality of error bytes of a certain row/column in a period of time (for example, from $T_0$ to $T_1$). The Founey procedure obtains the error values $V_1$ ($v_{11}$–$v_{1n}$) of the error bytes in another period of time (for example, from $T_1$ to $T_2$). The EDC procedure can then calculate the effects EDC($e_{11}$–$e_{1n}$) caused by the error bytes upon the error detection code in another period of time (for example, from $T_2$ to $T_3$). Therefore, before the time period from $T_2$ to $T_3$ (before the EDC procedure), the error values obtained from $T_1$ to $T_2$ and the positions of all error bytes obtained from $T_1$ to $T_2$ should be recorded completely. Therefore, a big memory space is required, the required storage time is long, the data amount of transmission in different procedures is large, and the number of computing and processing steps is larger. This reduces performance of the system and increases the production cost.

Figure 11:
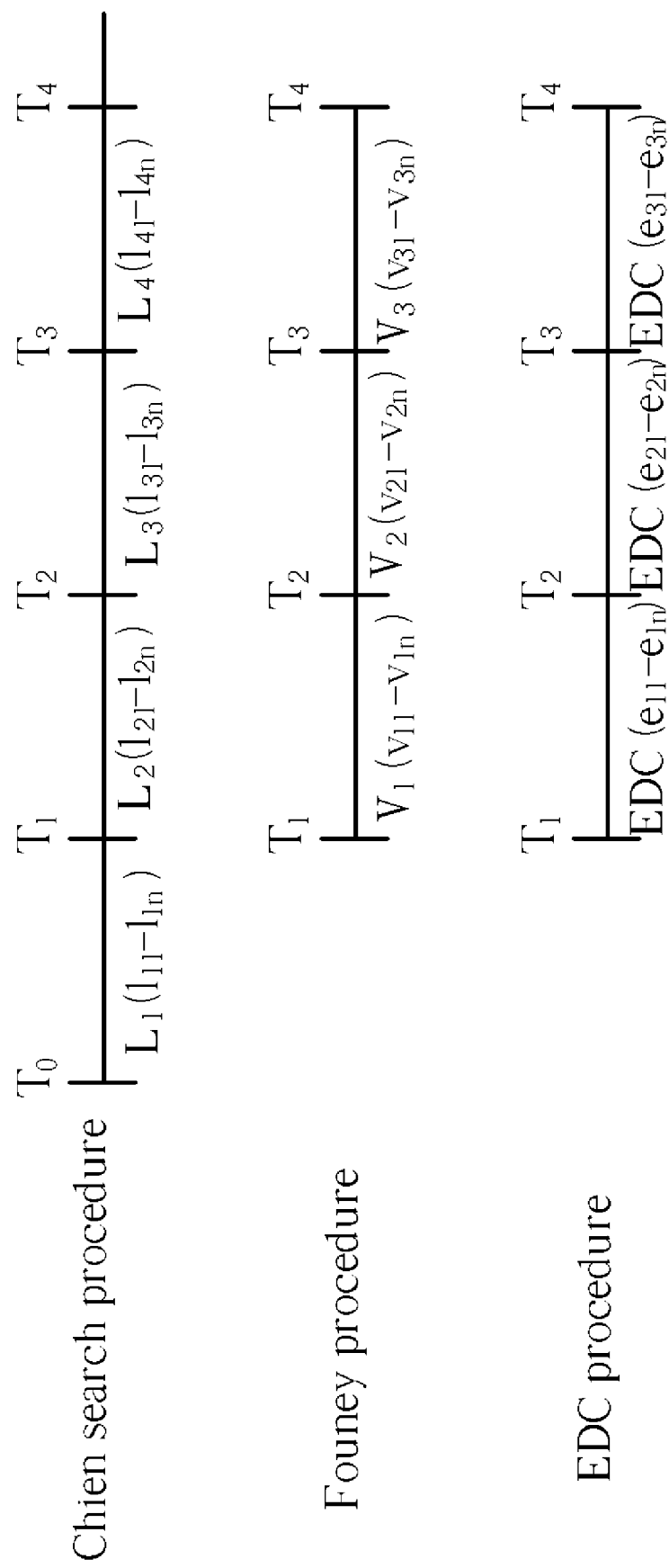

In response to the above-mentioned problem, the present invention further discloses another pipeline calculation method (as shown in FIG. 11). Succinctly, the Founey procedure and the EDC procedure are almost performed synchronously. If the Founey procedure obtains the error value of a certain error byte of a certain row/column (for example, $v_{11}$ shown in FIG. 11), the EDC procedure immediately calculates the effect (for example, $e_{11}$ shown in FIG. 11) caused by the error byte upon the error detection code (please note, at this time, the position $1_{11}$ and the error value $v_{11}$ have been obtained). After the effect is determined, the position ($1_{11}$) and error value ($v_{11}$) are immediately deleted from the memory such that only the effect upon the error detection code is left. In this way, the above-mentioned operation is continuously performed until all error values obtained by the Founey procedure are utilized in the EDC procedure. Obviously, in this way, the operation of se hing the positions of error bytes and the operation of calculating the error values of the error bytes can be divided into two different processes (i.e., the Chien Se h procedure and the Founey procedure). This can raise the flexibility in actual applications. On the other hand, this can make the operation of calculating the error values and the operation of calculating the error detection code (i.e., the Founey procedure and the EDC procedure) able to be performed almost synchronously such that the processing time is reduced. In addition, with the execution of the EDC procedure, after an error byte is encoded the position and error value of the error byte is not stored inside the memory. This can help to reduce the demands of memory space, storage time, and data amount of transmission. Clearly, the change shown in FIG. 11 can meet the demands.

Figure 12:
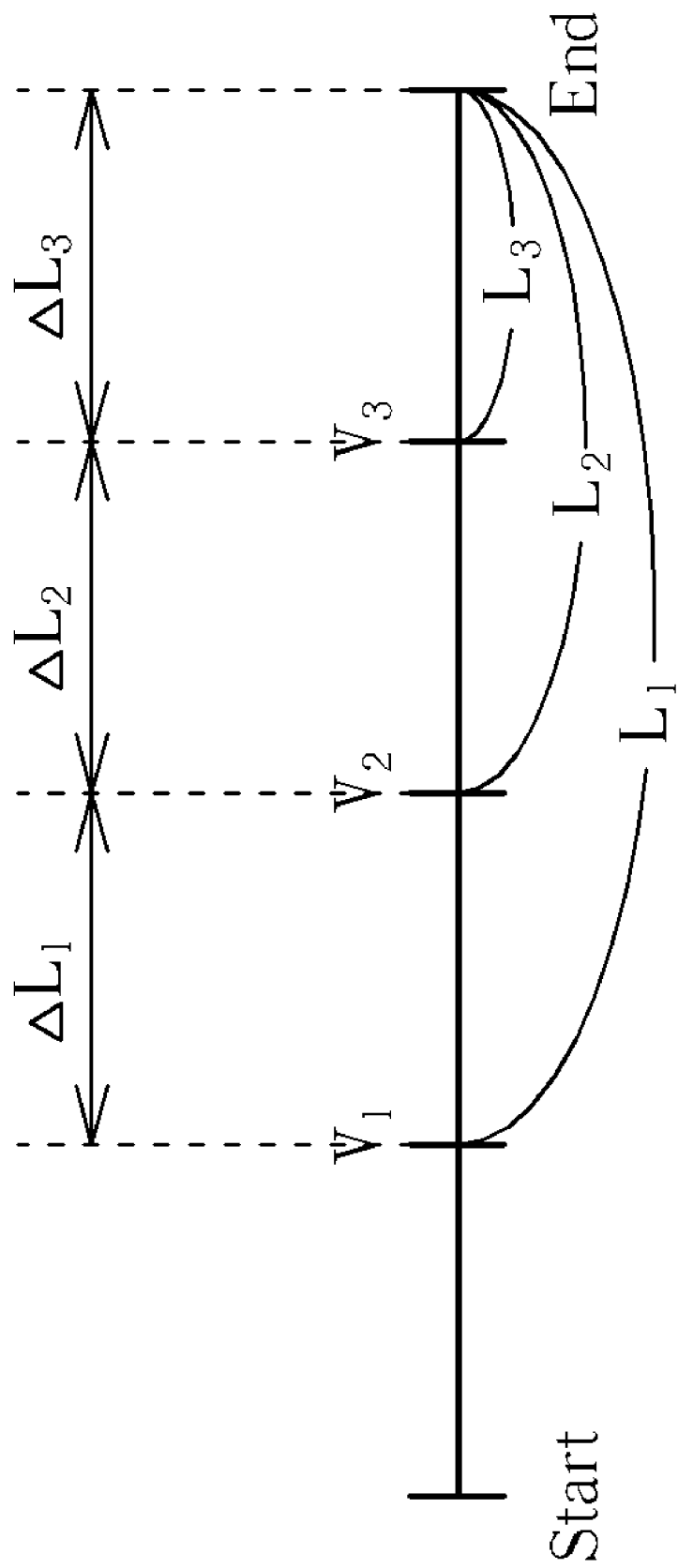

Furthermore, the implementation of the EDC procedure (as shown in FIG. 12) can utilize the in-sequence method because the prior art commonly processes rows/columns in-sequence. That is, when each row/column is processed, each time an error byte is processed, the corresponding displacement adjustment is performed on the error detection code according to the error value of the error byte. When a next error byte is processed, the error value is summed up with the error detection code processed by displacement adjustment, and then the displacement adjustment is applied to the summed error detection code. The above-mentioned operation is continuously performed until all bytes are completely processed and the error detection code is shifted to the end of the row/column using displacement adjustment. When the positions of error bytes are received, the displacement between the error bytes and the start of the row/column is received practically. At this time, although the length of each row/column is fixed (known), we can easily transform the displacement between the error bytes and the start of the row/column into the absolute displacement between the error bytes and the end of the row/column. However, because the prior art error detection code calculation utilizes the relative displacement between the error bytes and between the error bytes and the end of the row/column, the effects upon the error detection code EDC caused by error bytes having error bits can be simply illustrated by the following equation that computes the error detection code EDC using displacement conversion.

$$EDC = \Delta L_3 \{\Delta L_2[(\Delta L_1 V_1) + V_2] + V_3\}$$

$$= L_3\{(L_2 - L_3)[(L_1 L_2)V_1 + V_2]V_3\}$$

where $L_1$, $L_2$ and $L_3$ represent the displacements between error bytes and the end of the row/column, and $V_1$, $V_2$ and $V_3$ represent the error values of the error bytes.

Obviously, multiple calculation steps (two subtraction operations, one adding operation, and three multiplying operations) and three hardware devices (adder, subtractor, and multiplier) are needed. This raises the total cost and affecting the computation performance.

Figure 13:
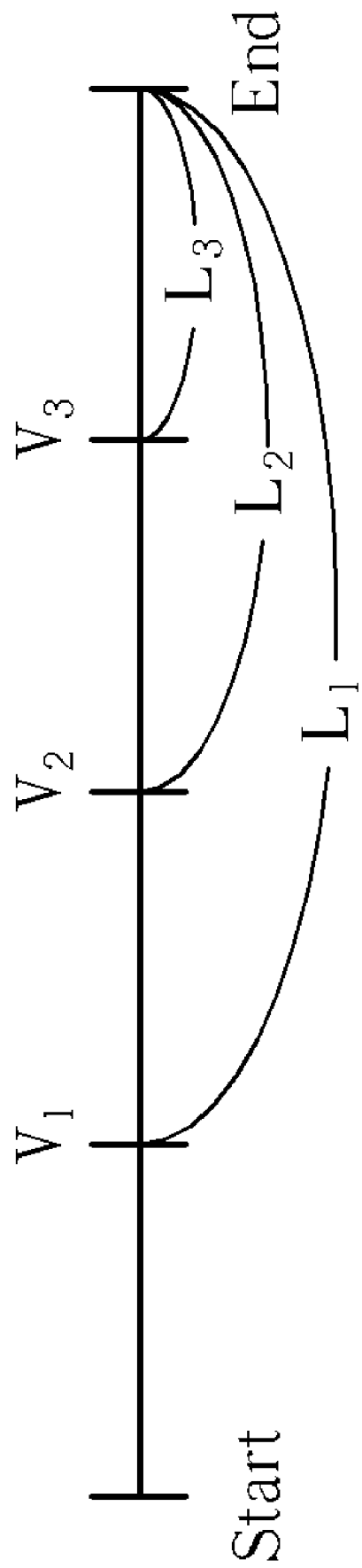

For the above-mentioned problem, the present invention further discloses another implementation of the EDC procedure. As shown in FIG. 13, at this time, the in-sequence method is no longer utilized. Instead, because the error detection code is only related to the displacement of the error value but not related to the displacement path, the present invention can utilize the above-mentioned characteristic. In other words, this embodiment directly moves the error value from the error byte to the end of a certain row/column and then calculates the effects upon the error detection code. That is, at this time, the effects upon the error detection code EDC caused by error bytes can be calculated by the following equation.

$$EDC = L_3 V_3 + L_2 V_2 + L_1 V_1$$

Obviously, the number of calculation steps is reduced, as only three multiplying operations and two adding operations, and only two hardware devices (adder and multiplier) are needed. In contrast to the process shown in FIG. 12, the process shown in FIG. 13 can further reduce the hardware cost and needed computation time.

A data block is divided into multiple data sectors, and each divided data sector has its corresponding error detection code. When the error detection code is being calculated, the data sector should be regarded as a unit to be processed. In other words, if the displacement between two error bytes goes across the boundary of two adjacent data sectors, the displacement should be divided to multiple displacements to process the effects upon the error detection code in different data sectors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method applied to an optical disc drive for calculating an error detection code corresponding to a data sector, the data sector comprising a plurality of bytes, the plurality of bytes arranged in a matrix, the matrix having N lines along a first direction and M lines along a second direction orthogonal to the first direction, the method comprising:
   (a) along the first direction, calculating error detection codes corresponding to M bytes located at each of the N lines, wherein for each of the N lines, only bytes having at least one error bit have a non-zero effect upon an error detection code corresponding to the line; and
   (b) adjusting an error detection code of each of the N lines according to a displacement between each of the N lines and a last line of the N lines, and then determining the error detection code of the data sector by summing up the displacement-adjusted error detection code of each of the N lines.

2. The method of claim 1, wherein the N lines are N columns of the matrix and the M lines are M rows of the matrix, or the N lines are N rows of the matrix and the M lines are M columns of the matrix.

3. The method of claim 1, wherein the step (b) further comprises:
   after calculating an error detection code of a $K^{th}$ line of the N lines, firstly adjusting the error detection code corresponding to the $K^{th}$ line according to a displacement between the $K^{th}$ line and the last line of the N lines and then calculating an error detection code corresponding to the $K+1^{th}$ line.

4. The method of claim 1, wherein the step (b) further comprises:
   after calculating error detection codes corresponding to a plurality of lines of the N lines, adjusting each error detection code corresponding to each line of the plurality of lines according to displacements between each line of the plurality of lines and the last line of the N lines.

5. The method of claim 1, wherein the step (b) further comprises:
   (b1) after an error detection code corresponding to a first line of the N lines is calculated, adjusting the error detection code corresponding to the first line according to a displacement between the first line and a second line of the N lines;
   (b2) after an error detection corresponding to the second line is calculated, utilizing a sum of the error detection code corresponding to the second line and the displacement-adjusted error detection code corresponding to the first line to update the error detection code corresponding to the second line; and
   repeatedly performing the steps (b1) and (b2) to obtain the error detection code of the data sector.

6. The method of claim 1, wherein in the step (a), each error detection code corresponding to the M bytes of each line of the N lines is calculated using an in-sequence process, and the in-sequence process comprises:
   calculating an error detection code corresponding to a first byte of a $K^{th}$ line of the N lines, and setting the error detection code corresponding to the first byte of the $K^{th}$ line as a temporarily stored error detection code of the $K^{th}$ line; and
   orderly processing a second byte through an $M^{th}$ byte of the $K^{th}$ line; wherein processing each byte from the second byte through the $M^{th}$ byte comprises:
   adjusting the temporarily stored detection code corresponding to a previous byte according to a displacement between the previous byte and a current byte; and
   calculating an error detection code corresponding to the current byte and setting a sum of an error detection code of the current byte and the displacement-adjusted error detection code corresponding to the previous byte as the temporarily stored error detection code of the $K^{th}$ line.

7. The method of claim 1, wherein in the step (a), each error detection code corresponding to M bytes of each line of N lines is generated in a parallel processing way, and the parallel processing way comprises:
   orderly processing a first byte through an $M^{th}$ byte of a $K^{th}$ line of the N lines, wherein processing each byte of the first byte to the $M^{th}$ byte comprises:
   calculating an error detection code of a current byte;
   adjusting the error detection code of the current byte according to a displacement between the current byte and a last byte of the $K^{th}$ line; and
   utilizing a summation of displacement-adjusted error detection codes of the first byte through the $M^{th}$ byte as an error detection code of the $K^{th}$ line.

8. The method of claim 1, further comprising:
   orderly executing a plurality of procedures to calculate the error detection code of the data sector, wherein only one procedure of the plurality of procedures is executed at a certain time, and the procedure is selected from the group consisting of: a procedure of checking whether a certain byte comprises error bits, a procedure of calculating an error value corresponding to a certain byte, and a procedure of calculating an error detection code.

9. The method of claim 1, further comprising:
performing a pipeline calculation to calculate the error detection code of the data sector, wherein at least two procedures are simultaneously performed, and the two procedures are selected from the group consisting of: a procedure of checking whether a certain byte comprises error bits, a procedure of calculating an error value corresponding to a certain byte; and a procedure of calculating an error detection code.

10. The method of claim 9, wherein the procedure of calculating an error value corresponding to a certain byte and a process of se hing a next byte having error bits are simultaneously performed, and the process of se hing a next byte having error bits is performed through orderly checking a plurality of bytes by performing the procedure of checking whether a certain byte comprises error bits.

11. The method of claim 9, further comprising:
utilizing a Chien se h procedure to determine a position of each byte having error bits;
utilizing a Founey procedure to calculate an error value of each byte having error bits; and
utilizing an EDC procedure to calculate an error detection code.

12. The method of claim 11, wherein the Chien se h procedure is performed every period after a first period to orderly check different bytes, the Founey procedure is performed every period after a second period to orderly check different bytes, the EDC procedure is performed every period after a third period to update the error detection code, wherein the Founey procedure is performed in each period to calculate error values corresponding to bytes found by the Chien se h in a previous period, and the EDC procedure is performed in each period to update the error detection code according to positions of bytes having error bits determined by the Chien se h procedure in a previous period and error values of bytes having error bits determined by the Founey procedure in the previous period.

13. The method of claim 12, wherein the Chien se h procedure checks a single byte in each period.

14. The method of claim 11, wherein the Chien se h procedure is performed per period after a first period to orderly check different bytes, the Founey procedure is performed per period after a second period to orderly check different bytes, the EDC procedure is performed per period after the second period to update an error detection code, wherein the Founey procedure is performed in each period to calculate error values corresponding to bytes determined by the Chien se h procedure in a previous period, and the third EDC procedure is performed in each period is to update the error detection code according to positions of bytes having error bits determined by the Chien se h procedure in a previous period and error values of bytes having error bits determined by the Founey procedure in a current period.

15. The method of claim 14, wherein the Chien se h procedure checks a plurality of bytes in each period.

16. The method of claim 14, wherein if three bytes having error bits, are discovered in a period; the three bytes are a first error byte, a second error byte, and a third error byte; and an equation utilized by the EDC procedure to calculate an error detection code EDC is:

$EDC=\Delta L_3\{\Delta L_2[(\Delta L_1 V_1)+V_2]+V_3\}$ wherein $V_1, V_2, V_3$ are error values of the first, second, third error bytes determined by the Founey procedure, $\Delta L_3$ is a displacement between the third error byte and a reference position, $\Delta L_2$ is a displacement between the second error byte and the first error byte, $\Delta L_2$ is a displacement between the first error byte and the second error byte, and the reference position is located behind the first, second, and third error bytes.

17. The method of claim 14, wherein if three bytes having error bits are discovered in a period, and the three bytes are a first error byte, a second error byte, and a third error byte, an equation utilized by the EDC procedure to calculate an error detection code EDC is:

$EDC=L_3 V_3+L_2 V_2+L_1 V_1$ wherein $V_1, V_2, V_3$ are error values of the first, second, third error bytes determined by the Founey procedure, and $L1$, $L2$, and $L3$ respectively represent a displacement between the first error byte and a reference position, a displacement between the second error byte and the reference position, and a displacement between the third error byte and the reference position.

18. A method applied to an optical disc drive for calculating an error detection code of a data sector, the data sector comprising a plurality of bytes, the plurality of bytes arranged in a matrix, the matrix having N lines along a first direction and M lines along a second direction orthogonal to the first direction, the method comprising:
along the first direction, calculating an error detection code generated by each byte of each line of N lines, wherein for each line of the N lines, only bytes having at least one error bit have a non-zero affect upon an error detection code corresponding to the line;
adjusting each non-zero error detection code corresponding to a byte according to a displacement between the byte and a reference position; and
summing up the displacement-adjusted non-zero error detection codes to generate the error detection code of the data sector.

\* \* \* \* \*